United States Patent
Bhat et al.

(10) Patent No.: US 10,613,174 B2
(45) Date of Patent: Apr. 7, 2020

(54) METHOD AND MAGNETIC RESONANCE APPARATUS FOR MAXWELL COMPENSATION IN SIMULTANEOUS MULTISLICE DATA ACQUISITIONS

(71) Applicant: Siemens Healthcare GmbH, Erlangen (DE)

(72) Inventors: Himanshu Bhat, Newton, MA (US); Uvo Hoelscher, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 246 days.

(21) Appl. No.: 15/337,578

(22) Filed: Oct. 28, 2016

(65) Prior Publication Data
US 2017/0123029 A1   May 4, 2017

Related U.S. Application Data

(60) Provisional application No. 62/247,833, filed on Oct. 29, 2015.

(51) Int. Cl.
*G01R 33/483* (2006.01)
*G01R 33/561* (2006.01)
(Continued)

(52) U.S. Cl.
CPC ...... *G01R 33/4835* (2013.01); *G01R 33/5611* (2013.01); *G01R 33/56341* (2013.01); *G01R 33/56581* (2013.01)

(58) Field of Classification Search
USPC ......................... 324/300–322; 600/407–435; 382/128–131
See application file for complete search history.

(56) References Cited

U.S. PATENT DOCUMENTS

| 5,923,168 | A | * | 7/1999 | Zhou | G01R 33/56581 324/307 |
| 2005/0033156 | A1 | * | 2/2005 | Kruger | G01R 33/243 600/410 |

(Continued)

OTHER PUBLICATIONS

Feinberg et al., "Simultaneous Echo Refocusing in EPI," Magnetic Resonance in Medicine, vol. 48, pp. 1-5 (2002).
(Continued)

*Primary Examiner* — Tung X Nguyen
*Assistant Examiner* — Robert P Alejnikov, Jr.
(74) *Attorney, Agent, or Firm* — Schiff Hardin LLP

(57) ABSTRACT

In a method and apparatus for acquiring magnetic resonance (MR) data, MR signals are acquired simultaneously from S slices, of a total of N slices of a subject, with S being an SMS factor. The N slices are respectively at different positions from an isocenter of the data acquisition scanner, thereby causing said MR signals to be affected differently by Maxwell terms of magnetic fields that give said MR signals respective signal dephasings that are dependent on the distance of a respective slice from the isocenter. The SMS MR data acquisition sequence is executed with a spacing between each pair of adjacent slices being less than N/S. Maxwell correction gradient moments are calculated at an average position between the S slices, thereby generating corrected k-space data wherein the signal dephasing of the MR signals from the S slices is reduced.

12 Claims, 5 Drawing Sheets

(51) Int. Cl.
*G01R 33/563* (2006.01)
*G01R 33/565* (2006.01)

(56) References Cited

U.S. PATENT DOCUMENTS

| | | | | |
|---|---|---|---|---|
| 2011/0044524 A1* | 2/2011 | Wang | ..................... | G01R 33/54 |
| | | | | 382/131 |
| 2013/0057281 A1* | 3/2013 | Feiweier | ............ | G01R 33/4835 |
| | | | | 324/309 |
| 2013/0285656 A1* | 10/2013 | Feiweier | ................ | G01R 33/56 |
| | | | | 324/309 |
| 2015/0279029 A1* | 10/2015 | Jensen | .................. | G06T 7/0012 |
| | | | | 382/131 |

OTHER PUBLICATIONS

Meier et al., "Concomitant Field Terms for Asymmetric Gradient Coils: Consequences for Diffusion, Flow and Echo-Planar Imaging," Magnetic Resonance in Medicine, vol. 60, pp. 128-134 (2008).
Setsompop et al., "Improving Diffusion MRI Using Simultaneous Multi-Slice Echo Planar Imaging," NeuroImage, vol. 63, pp. 569-580 (2012).
Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Cauley et al., "Interslice Leakage Artifact Reduction Technique for Simultaneous Multislice Acquisitions," Magnetic Resonance in Medicine, vol. 72, pp. 93-102 (2014).

* cited by examiner

METHOD AND MAGNETIC RESONANCE APPARATUS FOR MAXWELL COMPENSATION IN SIMULTANEOUS MULTISLICE DATA ACQUISITIONS

RELATED APPLICATION

The present application claims the benefit of the filing date of Provisional Application Control No. 62/247,833, filed Oct. 29, 2015, the content of which is incorporated herein by reference.

BACKGROUND OF THE INVENTION

Field of the Invention

The present invention concerns the field of magnetic resonance imaging, and in particular to magnetic resonance imaging techniques wherein magnetic resonance signals are acquired simultaneously from multiple slices of a subject.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency gives the excited spins a magnetization that causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The emitted MR signals have a signal intensity that is dependent on the exponential decay over time of the magnetization of the nuclear spins. The acquired signals are digitized so as to form raw data, which are entered into a memory that is organized as k-space, as k-space data. Many techniques are known for reconstructing an image of the examination object from the k-space data.

By appropriately selecting different characteristics of the MR data acquisition sequence that is used, the acquired signals can be differently weighted so that different sources of the detected MR signals (i.e., different tissues in the case of medical MR imaging) appear with different contrasts in the reconstructed image. In the case of medical MR imaging, a weighting is selected that causes the tissue that is important for making the intended medical diagnosis to have the best contrast (brightness) in the reconstructed image. One such type of weighting is known as T1-weighting, because it depends on the so-called T1 relaxation time of the nuclear spins.

Many different techniques are known for acquiring the raw MR data. One such technique is known as simultaneous multi-slice (SMS) acquisition, which is a technique for accelerating the acquisition of the data from a given volume of the examination object, wherein nuclear spins in multiple slices are excited simultaneously, and the resulting MR signals are simultaneously acquired from each slice. This results in a dataset in k-space that is composed of data from the multiple slices collapsed on top of each other. Techniques are known for separating or uncollapsing the data for these respective slices during image reconstruction, such as the slice GRAPPA (Generalized Autocalibration Partially Parallel Acquisitions) technique, which is schematically illustrated in FIG. 1. In the example shown in FIG. 1, multiple slices S1, S2 and S3 are excited simultaneously, resulting in each slice generating an echo train of magnetic resonance signals, which are acquired according to the known blipped CAIPIRINHA (Controlled Aliasing in Parallel Imaging Results in Higher Acceleration) technique (also called blipped CAIPI below). Details of such techniques are described, for example, in Setsompop et al., "Blipped-Controlled Aliasing in Parallel Imaging for Simultaneous Multislice Echo Planar Imaging With Reduced g-Factor Penalty," Magnetic Resonance in Medicine, Vol. 67, pp. 1210-1224 (2012) and Setsompop et al., "Improving Diffusion MRI Using Simultaneous Multi-Slice Echo Planar Imaging," NeuroImage, Vol. 63, pp. 569-580 (2012) and Cauley et al., "Interslice Leakage Artifact Reduction Technique for Simultaneous Multislice Acquisitions," Magnetic Resonance in Medicine, Vol. 72, pp. 93-102 (2014).

A further type of magnetic resonance imaging is known as diffusion imaging, or diffusion-weighted imaging. This imaging technique is based on the fact that, due to their thermal energy, water molecules in tissue exhibit continuous random motion, known as Brownian motion. Water molecules contain hydrogen atoms, which are the most common atoms that are excited to resonance in magnetic resonance imaging. Because the excited water spins exhibiting this motion will encounter components of their cellular environment that exhibit different concentrations in different regions, the excited water spins will spread (diffuse) at different rates in different directions. In particular, the cell membranes restrict such diffusion. The basis of diffusion imaging is to activate magnetic field gradients in pairs so as to encode the spatial motion of the molecules. The signal intensity S in diffusion imaging is represented by the following equation:

$$S = S_0 \cdot \exp(-b \cdot ADC)$$

wherein ADC is the apparent diffusion coefficient and b is the gradient factor, commonly referred to as the b factor. This factor represents a "summary" of the effect of the performance in diffusion gradients. The sensitivity to diffusion-based contrast is primarily dependent on the b factor value. So is the signal intensity when no diffusion gradients are present.

Diffusion-weighted echo planar images acquired with a twice refocused scheme (called bipolar encoding) with high b factor values suffer from a slice-position dependent signal dephasing. This dephasing is caused by additional, unintended magnetic field gradients, which occur as a consequence of the Maxwell equations, these fields being referred to as concomitant fields, having Maxwell terms. In a first order approximation, the effect of such Maxwell terms exhibits a quadratic dependency on the gradient amplitude and the spatial distance from the isocenter of the basic field magnet in the data acquisition scanner, i.e., it is inversely proportional to the basic magnetic field. Details of the reasons for and the effect of such fields are described in Meier et al., "Concomitant Field Terms for Asymmetric Gradient Coils: Consequences for Diffusion, Flow and Echo-Planar Imaging," Magnetic Resonance in Medicine, Vol. 60, pp. 128-134 (2008).

The effect of such concomitant fields is more prominent at low field strengths of the basic magnetic field, such as 1.5 T, with high diffusion gradient amplitudes (i.e., high b factor values) and slices that are far off-center. For acquisitions using the Stejskal-Tanner diffusion scheme (called monopolar encoding), the concomitant fields from the intentionally-present diffusion gradients primarily lead to a deviation from the intended gradient amplitude, and thus from the intended b factor value. For bipolar acquisitions, however, this effect causes a signal dephasing, because the opposite gradient lobes are no longer balanced, as shown in FIG. 2 herein, which is FIG. 2 from the above-mentioned Meier et al. article. The conventional solution to this problem is to calculate slice-specific and gradient-specific correction moments, based on the equations presented in the aforementioned article by Meier et al. These calculated moments are then added to the bipolar diffusion-encoding gradients in order to compensate for the Maxwell terms.

In simultaneous multislice (SMS) acquisitions, such as the aforementioned blipped CAIPI, two or more slices are excited simultaneously by a linear combination of the respective slice-specific pulses, and are acquired as a collapsed dataset (i.e., data from all simultaneously excited slices), which can be separated into respective slices again in a separate post-processing step, such as by using slice GRAPPA, as noted above with regard to FIG. 1. For higher acceleration factors S (i.e., more simultaneously excited slices), and coils with few coil elements, it is desirable to maximize the spacing between the simultaneously acquired slices, in order to reduce the g-factor penalty.

The g-factor penalty results from the fact that the individual signals in SMS imaging are superimposed, the signals being received from respective individual coils of the MR data acquisition scanner. These coils necessarily individually occupy different spatial positions, but are in close enough proximity to each other so that the same nuclear spins will be detected by more than one of the multiple coils. Because each coil is situated at a different position in space, however, the effect of each individual coil on the reception of a given individual nuclear spin will be slightly different, and must be taken into account. This is done by calculating the aforementioned g-factor (geometry factor) for the coil array that is used. The extent to which the g-factor degrades the resulting reconstructed image is called the g-factor penalty. As noted above, in order to reduce the g-factor in SMS imaging, interslice image shifts are deliberately induced during the readout in blipped CAIPI, either by gradient blips on the slice axis or by modulating the phase of the RF pulses. After the data have been acquired, the simultaneously excited slices are collapsed into a single slice for entry of the data into k-space. The individual slices can be separated in the post processing, using the aforementioned slice GRAPPA technique as schematically illustrated in FIG. 1.

For SMS acquisitions, the aforementioned Maxwell compensation technique is not applicable, because the calculated correction moments are slice position-specific, and thus cannot be applied at the same time to two slices having a large spatial separation therebetween. This can lead to signal degradation, especially for slices acquired far off-center with high b-values at low magnetic fields. A correction method is described in United States Patent Application Publication No. 2013/0285656 wherein the respective pulses for the slices to be acquired simultaneously are shifted in time before the linear combination. The slice gradient then exhibits different asymmetries for the respective slice pulses. These non-balance slice-selection gradient moments are expected to provide a similar compensation behavior as the aforementioned method for the single-slice variant. This method, however, requires calculating a different combined pulse profile for each set of slice positions, which may lead to different acquisition times per slice set.

SUMMARY OF THE INVENTION

Consistent with the above explanation in conventional acquisitions it is most beneficial to separate the simultaneously acquired slices as far as possible in space, in order to minimize the retained SNR in the slice grappa reconstruction. The present invention is based on the insight that in cases where the SNR degradation caused by concomitant fields is much higher than the SNR penalty caused by the g-factor, a different slice acquisition scheme can be used, which enables correction of the Maxwell terms.

The basis of the present invention is a reduction of the spatial distance of simultaneously acquired slices, and to calculate the Maxwell correction gradient moments at an average position between those slices. This calculated moment is not exactly correct for either of the slices, but still enables a relatively accurate correction for each individual slice. The average can either be an exact average or a weighted average, dependent on which slices need to be corrected more accurately.

DESCRIPTION OF THE PREFERRED EMBODIMENTS

Figure 1:
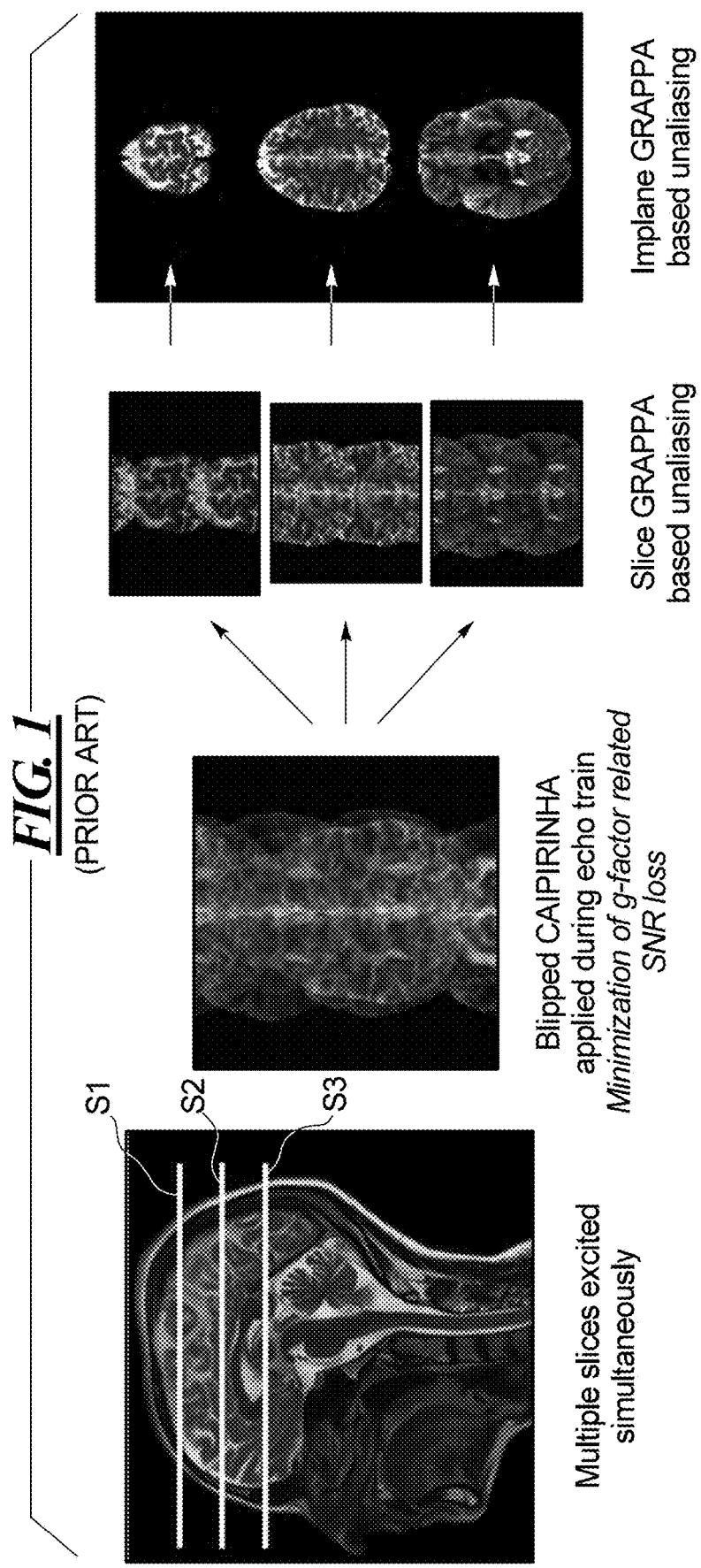
FIG. 1, as noted above, schematically illustrates a conventional SMS acceleration technique.
Figure 2:
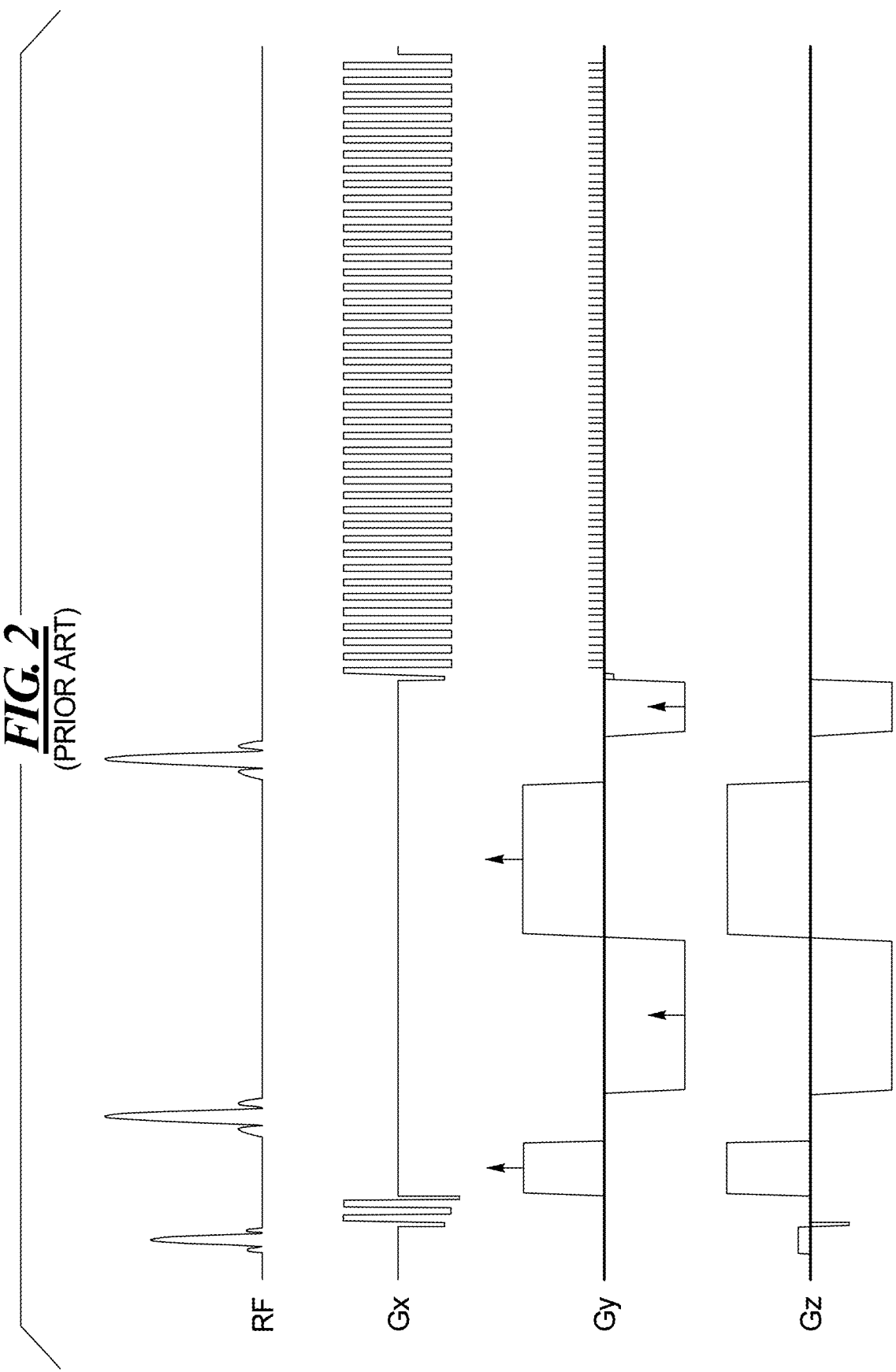
FIG. 2, as noted above, is a pulse diagram showing the effect of concomitant fields on diffusion-weighted acquisitions with bipolar diffusion encoding (taken from Meier et al.).
Figure 3:
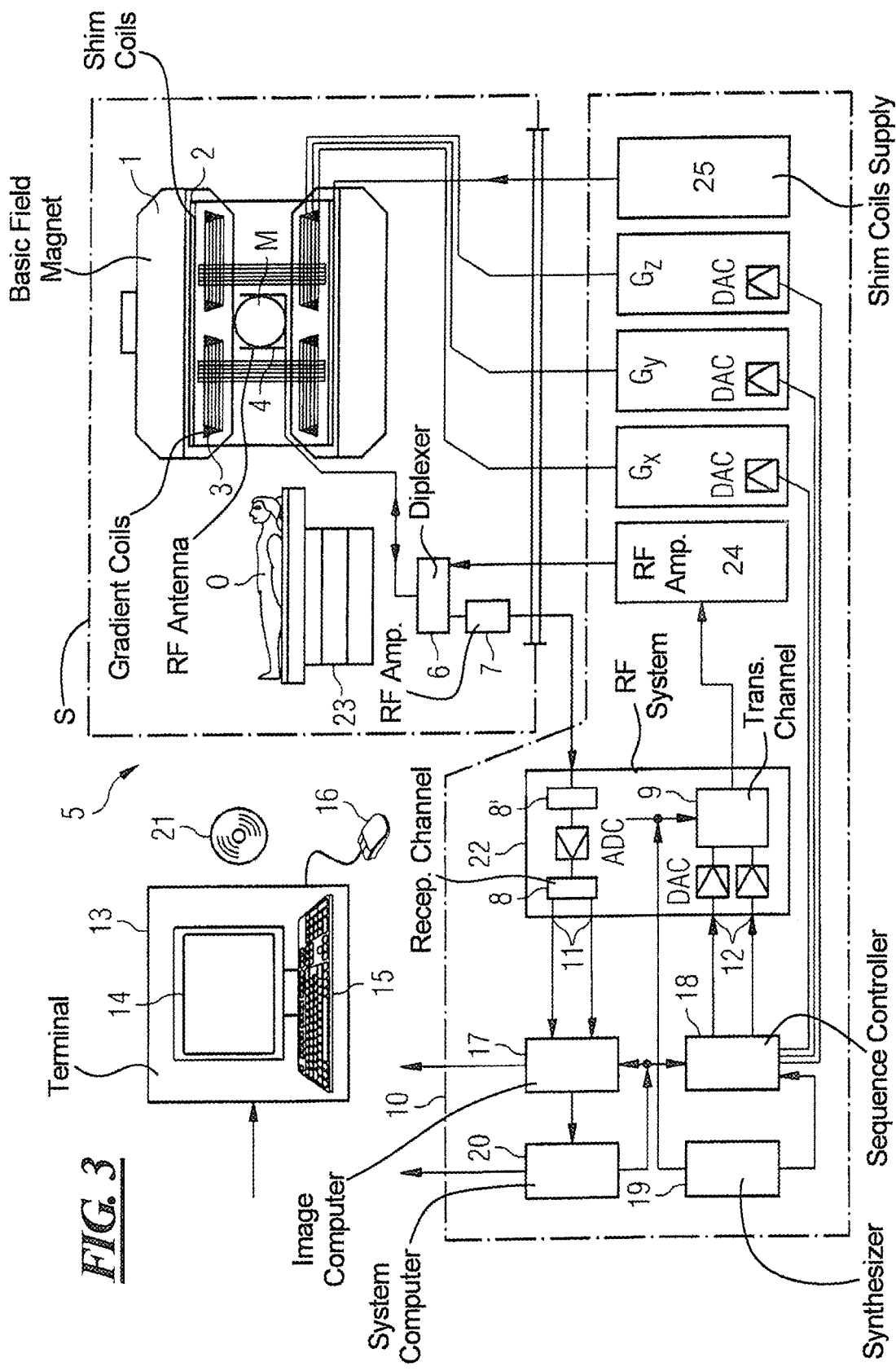
FIG. 3 schematically illustrates a magnetic resonance apparatus constructed and operating in accordance with the present invention.

FIG. 3 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject 0, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate shim coil supply 25 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier $G_x$, $G_y$ and $G_z$ has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel formed by modulars 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via the RF power amplifier 24.

Switching from transmitting to receiving operation occurs via a transmission-receiving switch 6. The RF transmitting coil of the radio-frequency antenna 4 radiates the radio-frequency frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

A table showing an example of a conventional and a proposed acquisition scheme for 12 slices is shown below. There are many more combinations that are possible, which are always a tradeoff between Maxwell correction accuracy (slices together in space), slice GRAPPA fidelity, and g-factor SNR loss (slices separated as far as possible in space) and slice crosstalk (slice sets that are adjacent in space are not excited adjacent in time).

| Anatomical slice | Conventional excitation order | Inventive excitation order |
|---|---|---|
| 1 | 1 | 1 |
| 2 | 4 | 4 |
| 3 | 2 | 1 |
| 4 | 5 | 4 |
| 5 | 3 | 2 |
| 6 | 6 | 5 |
| 7 | 1 | 2 |
| 8 | 4 | 5 |
| 9 | 2 | 3 |
| 10 | 5 | 6 |
| 11 | 3 | 3 |
| 12 | 6 | 6 |

Figure 4:
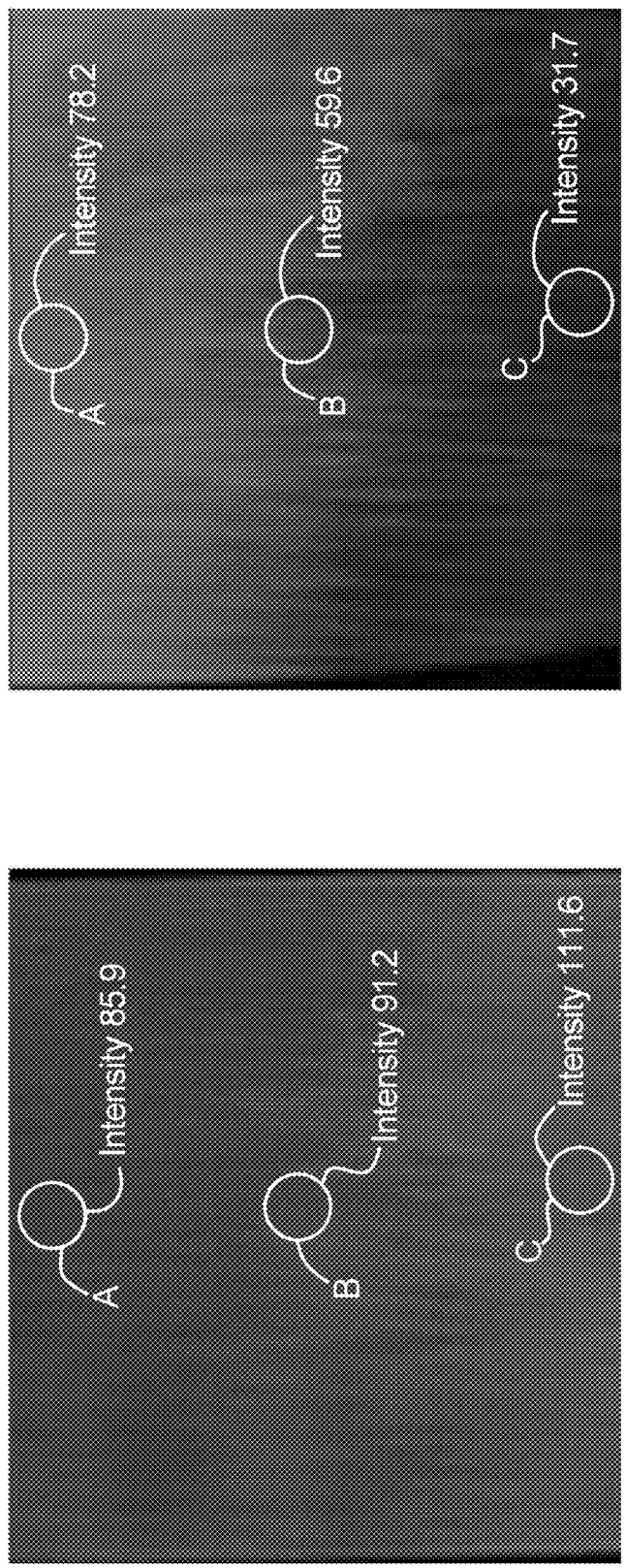
FIG. 4 shows a coronal projection of a transverse isocenter acquisition in diffusion imaging with b=1,000 showing intensities for different regions of the image with the use of the inventive method (left image) and without the use of the inventive method (right image).

FIG. 4 illustrates the SNR gain that is attainable with the inventive method, compared to a conventional method without correction, for a diffusion-weighted image with b=1,000. FIG. 4 is a coronal projection of a transverse isocenter acquisition, covering a range of 12 cm, and containing 12 slices with slices 1 and 3 excited simultaneously, and so forth, in the left image and with slices 1 and 7 excited simultaneously, and so forth, in the right image. As can be seen by the signal intensities of the respective same regions A, B and C in both images, the inventive correction in the left image produces significantly higher intensity values.

The 12 slices in the example shown in FIG. 4 each had a slice thickness of 10 mm, for a total slab thickness of 120 mm. In this example, the center of the slab is positioned at the scanner isocenter. The data were acquired at 1.5 T, with a 20 channel head/neck coil. The distance of the simultaneously excited slices in the left image in accordance with the invention is 20 mm, compared to 60 mm in the conventional image. The signal dropout is significantly decreased, while at the same time no GRAPPA artifacts are visible, which demonstrates the feasibility of the inventive method even with a low number of channel coils. The aforementioned parameters associated with the results shown in FIG. 4 are but one example of many other combinations of parameters that can be used in accordance with the invention.

Figure 5:
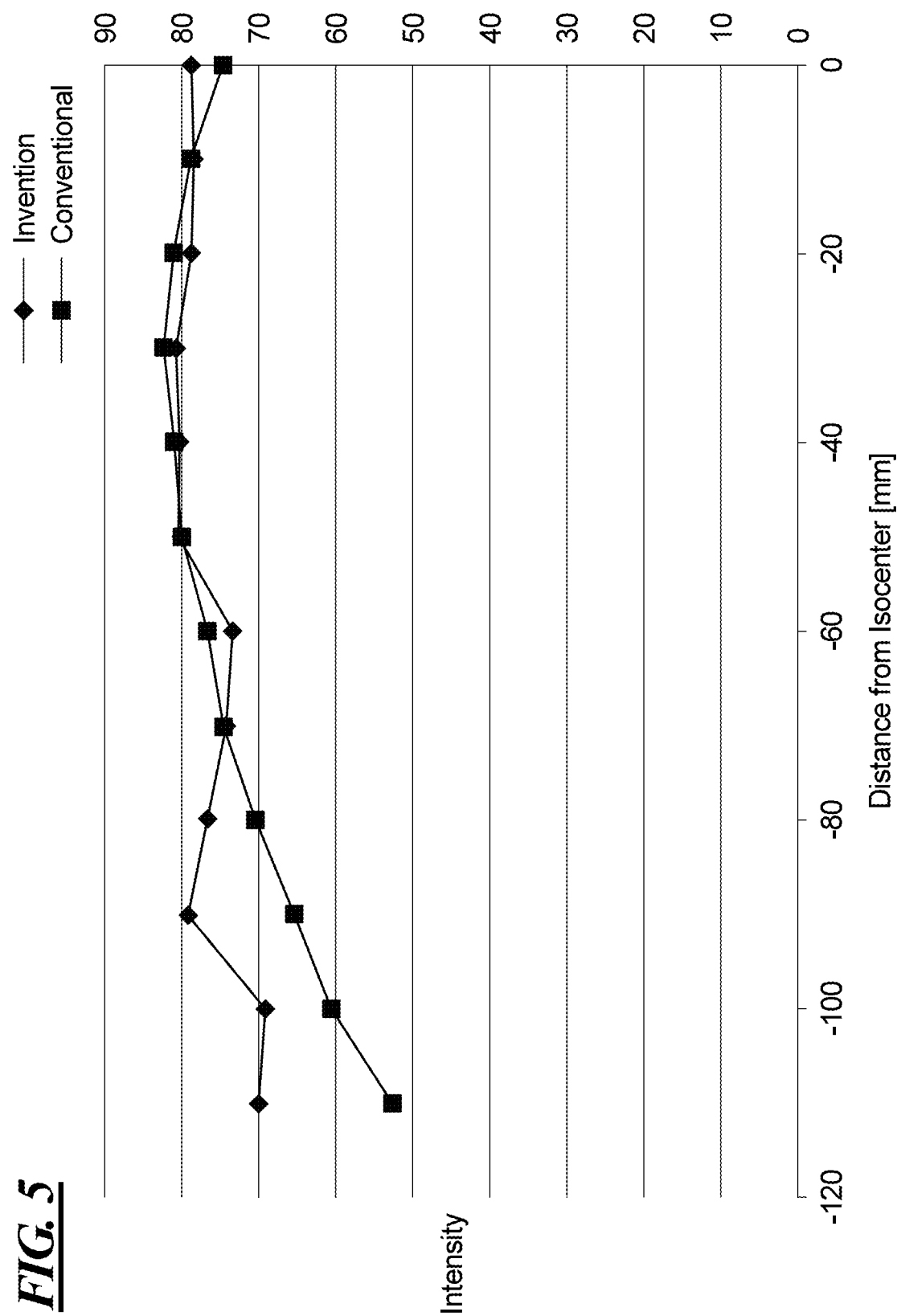
FIG. 5 is a signal comparison of 12 slices with off-center acquisition dependent on distance from the isocenter, with and without the inventive method.

FIG. 5 shows corresponding SNR values for an off-center acquisition, with the inventive method and the conventional method. In this case, slight inter-slice signal jumps are noticeable. Here, it might be beneficial to either further reduce the slice gap, or to keep the conventional acquisition scheme, but still calculate intermediate correction moments in order to retain a smooth image transition when viewing or scrolling through the respective images.

As noted above, the spacing between the adjacent slices that are averaged in accordance with the invention for the Maxwell compensation is essentially a compromise between achieving an optimum Maxwell compensation while not producing slice artifacts in the slice GRAPPA reconstruction. In the example shown in FIG. 4, this spacing was selected as 20 mm. In general, however, for N simultaneously acquired slices with an SMS factor of S, the spacing between adjacent slices is preferably expressed as N/2S. The best reduction can be achieved by reducing the distance so that this value is 1, meaning that the slices are excited back-to-back. In this case, however, the reconstruction result would be deteriorated, even though this would be the best in terms of Maxwell term reduction. Therefore, the method ideally operates with N/2S approaching a value of 1 as a limit value.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data, comprising:
using a computer to operate an MR data acquisition scanner to execute a simultaneous multi-slice (SMS) MR data acquisition sequence wherein MR signals are acquired simultaneously from S slices, of a total of N slices of an examination subject, each of said N slices having a same thickness, by simultaneously exciting or refocusing said S slices with S being an SMS acceleration factor, said S slices respectively being at different positions from an isocenter of the data acquisition scanner and thereby causing said MR signals to be affected differently by Maxwell terms of magnetic fields in said data acquisition scanner that give said MR signals respective signal dephasings that are dependent on the distance of a respective slice from the isocenter;
using said computer to operate said MR data acquisition scanner to execute said SMS MR data acquisition sequence with a respective spacing between said S slices, among said N slices, being less than N/S slices;
via said computer, entering the acquired MR signals as numerical values representing k-space data in an electronic memory;
in said computer applying a Maxwell correction algorithm to said k-space data by calculating Maxwell correction gradient moments at an average position between said S slices, and thereby generating corrected k-space data wherein the respective signal dephasing of the respective MR signals from said S slices is reduced; and
via said computer, making said corrected k-space data available from said memory in electronic form as a data file.

2. A method as claimed in claim 1 comprising using said computer to operate said MR data acquisition scanner to execute said SMS MR data acquisition sequence with N/S=1.

3. A method as claimed in claim 1 comprising using said computer to operate said MR data acquisition scanner to execute said SMS MR data acquisition sequence with N/S approaching a value of 1 as a limit.

4. A method as claimed in claim 1 comprising using said computer to operate said MR data acquisition scanner to execute said SMS MR data acquisition sequence as a diffusion-weighted MR data acquisition sequence.

5. A method as claimed in claim 4 comprising using said computer to operate said MR data acquisition scanner to execute said diffusion weighted MR data acquisition sequence with a b factor of 1000 and with N=12, with each slice having a 10 mm slice thickness, and with N/S being 20 mm.

6. A method as claimed in claim 5 comprising using said computer to reconstruct image data from said corrected k-space data in said data file by applying a GeneRalized Autocalibrating Partial Parallel Acquisition (GRAPPA) reconstruction algorithm to said corrected k-space data.

7. A magnetic resonance (MR) apparatus, comprising:
an MR data acquisition scanner;
a computer configured to operate said MR data acquisition scanner to execute a simultaneous multi-slice (SMS) MR data acquisition sequence wherein MR signals are acquired simultaneously from S slices, of a total of N slices of an examination subject, each of said N slices having a same thickness, by simultaneously exciting or refocusing said S slices with S being an SMS acceleration factor, said S slices respectively being at different positions from an isocenter of the data acquisition scanner and thereby causing said MR signals to be affected differently by Maxwell terms of magnetic fields in said data acquisition scanner that give said MR signals respective signal dephasings that are dependent on the distance of a respective slice from the isocenter;
said computer being configured to operate said MR data acquisition scanner to execute said SMS MR data acquisition sequence with a respective spacing between said S slices, among said N slices, being less than N/S slices;
an electronic memory in communication with said computer;
said computer being configured to enter the acquired MR signals as numerical values representing k-space data in said electronic memory;
said computer being configured to apply a Maxwell correction algorithm to said k-space data by calculating Maxwell correction gradient moments at an average position between said S slices, and thereby generating corrected k-space data wherein the respective signal dephasing of the respective MR signals from said S slices is reduced; and
said computer being configured to make said corrected k-space data available from said memory in electronic form as a data file.

8. An apparatus as claimed in claim 7 wherein said computer is configured to operate said MR data acquisition scanner to execute said SMS MR data acquisition sequence with N/S=1.

9. An apparatus as claimed in claim 7 wherein said computer is configured to operate said MR data acquisition scanner to execute said SMS MR data acquisition sequence with N/S approaching a value of 1 as a limit.

10. An apparatus as claimed in claim 7 comprising using said computer to operate said MR data acquisition scanner to execute said SMS MR data acquisition sequence as a diffusion-weighted MR data acquisition sequence.

11. An apparatus as claimed in claim 10 wherein said computer is configured to operate said MR data acquisition scanner to execute said diffusion weighted MR data acquisition sequence with a b factor of 1000 and with N=12, with each slice having a 10mm slice thickness, and with N/S being 20 mm.

12. An apparatus as claimed in claim 11 wherein said computer is configured to reconstruct image data from said corrected k-space data in said data file by applying a GeneRalized Autocalibrating Partial Parallel Acquisition (GRAPPA) reconstruction algorithm to said corrected k-space data.

* * * * *